(12) United States Patent
Chen et al.

(10) Patent No.: US 7,495,915 B2
(45) Date of Patent: Feb. 24, 2009

(54) HEAT DISSIPATION SYSTEM

(75) Inventors: Yong-Dong Chen, Shenzhen (CN); Guang Yu, Shenzhen (CN); Chun-Chi Chen, Taipei Hsien (TW); Shih-Hsun Wung, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/626,049

(22) Filed: Jan. 23, 2007

(65) Prior Publication Data

US 2008/0123296 A1    May 29, 2008

(51) Int. Cl.
*H05K 7/20* (2006.01)

(52) U.S. Cl. .............. 361/700; 361/699; 174/15.2; 165/80.3; 165/80.4; 165/104.33

(58) Field of Classification Search .............. None
See application file for complete search history.

(56) References Cited

U.S. PATENT DOCUMENTS

| | | | |
|---|---|---|---|
| 5,949,648 A * | 9/1999 | Liao .............. | 361/700 |
| 6,407,916 B1 | 6/2002 | Konstad | |
| 6,459,576 B1 | 10/2002 | Bhatia et al. | |
| 6,882,536 B2 * | 4/2005 | Deeney et al. .............. | 361/719 |
| 6,937,474 B2 * | 8/2005 | Lee .............. | 361/715 |
| 7,019,974 B2 * | 3/2006 | Lee et al. .............. | 361/700 |
| 7,130,193 B2 * | 10/2006 | Hirafuji et al. .............. | 361/700 |
| 7,209,356 B2 * | 4/2007 | Lee et al. .............. | 361/719 |
| 7,319,588 B2 * | 1/2008 | Peng et al. .............. | 361/700 |
| 7,327,576 B2 * | 2/2008 | Lee et al. .............. | 361/719 |
| 2006/0238980 A1 * | 10/2006 | Bhattacharyya et al. ..... | 361/700 |
| 2007/0091578 A1 * | 4/2007 | Chang et al. .............. | 361/719 |
| 2007/0217162 A1 * | 9/2007 | Zhou et al. .............. | 361/710 |

\* cited by examiner

*Primary Examiner*—Boris L Chervinsky
(74) *Attorney, Agent, or Firm*—Frank R. Niranjan

(57) ABSTRACT

A heat dissipation system is used for dissipating heat generated by an electronic device mounted on a printed circuit board. The heat dissipation system includes an enclosure adapted to receive the electronic device therein, the enclosure having a base plate on which the printed circuit board is mounted. A spreader adapted for contacting the electronic device in the enclosure. A plurality of fins disposed between the printed circuit board and the base plate, the fins thermally engaging with the base plate. A heat pipe is used to thermally connect the spreader and the fins together, which are positioned at opposite sides of the printed circuit board, respectively. Accordingly, the enclosure can help to dissipate the heat generated by the electronic device.

14 Claims, 3 Drawing Sheets

HEAT DISSIPATION SYSTEM

BACKGROUND OF THE INVENTION

1. Field of the Invention

The present invention relates to a heat dissipation system for removing heat from electronic devices, and more particularly to a heat dissipation system incorporating heat pipes and an enclosure of an electronic equipment for improving heat dissipation efficiency of the heat dissipation system.

2. Description of Related Art

During operation of an electronic device such as a central processing unit (CPU), a large amount of heat is often produced. The heat must be quickly removed from the electronic device to prevent it from becoming unstable or being damaged. Typically, a heat sink is attached to an outer surface of the electronic device to absorb the heat from the electronic device. The heat absorbed by the heat sink is then dissipated to ambient air.

Typically, the heat sink comprises a solid metal base attached on the electronic device, and a plurality of fins arranged on the base. The base is intimately attached to the electronic device thereby absorbing the heat generated by the electronic device. Most of the heat accumulated at the base is transferred to the fins and then dissipates away from the fins. Generally, the heat sink is constructed to meet heat dissipation demands of the heat generating electronic device by increasing the area and amount of the fins thereof. However, with the rapid development of electronic devices heat output has also increased whilst most computers have reduced in size. Consequently, heat sinks can no longer meet the heat dissipation requirements of electronic devices.

What is needed, therefore, is a heat dissipation system which can achieve a greater heat dissipation capability.

SUMMARY OF THE INVENTION

A heat dissipation system is used for dissipating heat generated by an electronic device mounted on a printed circuit board; the heat dissipation system includes an enclosure adapted to receive the electronic device therein, the enclosure having a base plate on which the printed circuit board is mounted. A spreader is adapted for contacting the electronic device in the enclosure. A plurality of fins disposed between the printed circuit board and the base plate, the fins thermally engaging with the base plate. A heat pipe thermally connects the spreader and the fins together. The spreader and the fins are positioned at opposite sides of the printed circuit board. A part of heat generated by the electronic device can be transferred to the base plate of the enclosure by the heat pipe and the fins to be dissipated to atmosphere, whereby the heat can be effectively dissipated.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
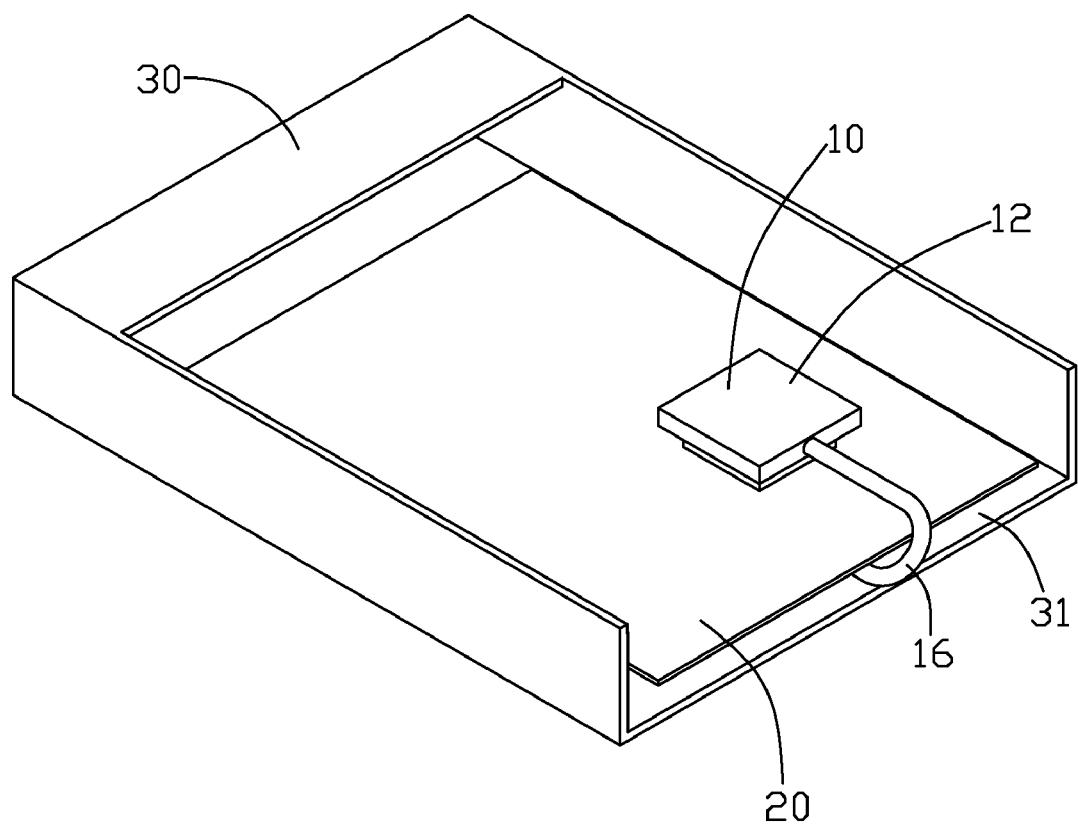
FIG. 1 is an assembled, isometric view of a heat dissipation system in accordance with a preferred embodiment of the present invention.
Figure 2:
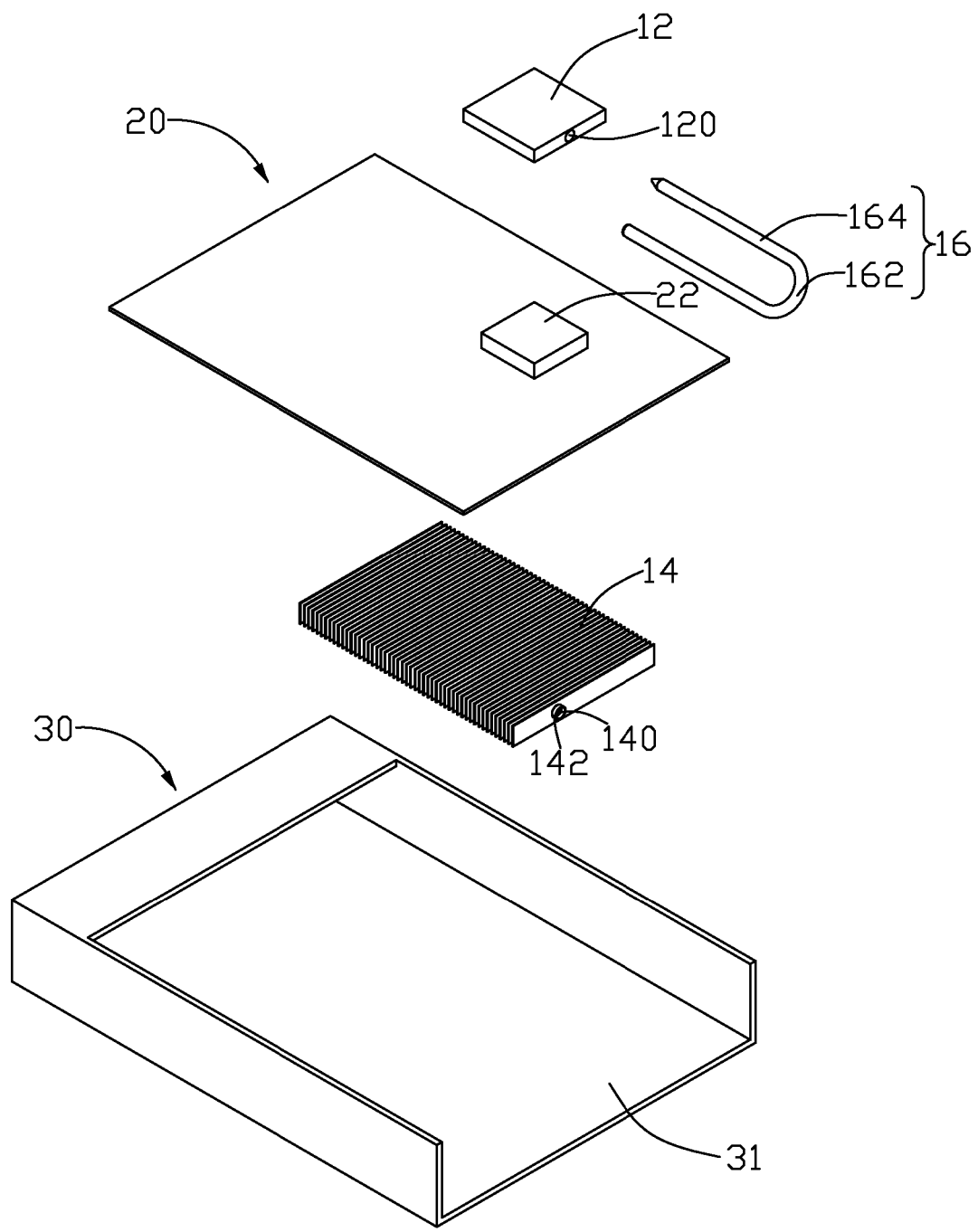
FIG. 2 is an exploded view of FIG. 1.
Figure 3:
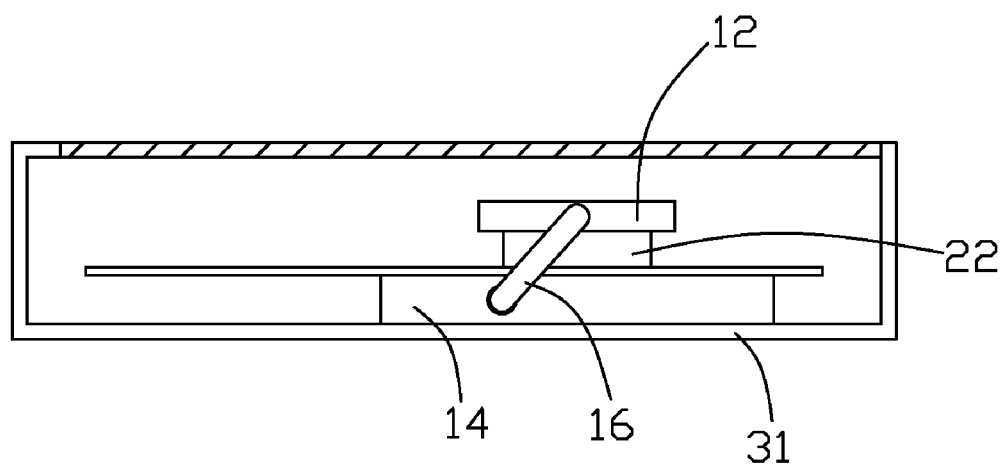
FIG. 3 is a side elevation view of FIG. 1.

Referring to FIGS. 1-3, a heat dissipation system 10 in accordance with a preferred embodiment of the present invention is shown. The heat dissipation system 10 is used for dissipating heat generated by an electronic device such as a CPU 22 mounted on a printed circuit board 20 in an enclosure 30. The heat dissipation system 10 comprises a spreader 12 located above the printed circuit board 20, a plurality of fins 14 located beneath the printed circuit board 20, and a heat pipe 16 thermally connecting the spreader 12 and the fins 14. In other words, the spreader 12 and the fins 14 are positioned at opposite sides of the printed circuit board 20, and are in indirectly thermal engaging relation with each other via the heat pipe 16. [0012] The enclosure 30 is substantially a quadrate box and made of a material, such as a metal with good heat conductivity, corrosion resistance and strength. A zinc-coated steel plate is suitable for forming the enclosure 30. The enclosure 30 comprises a base plate 31, on which the printed circuit board 20 is mounted.

The spreader 12 is made of a material with good heat conductivity, such as copper, aluminum and so on, and has a bottom face intimately contacting with a top of the CPU 22 for absorbing heat from the CPU 22. A clip (not shown) can be used to achieve the intimate contacting between the spreader 12 and the CPU 22. Since such a clip is well known to those skilled in the art, it is not shown or disclosed into details herein. A circular channel 120 is defined within the spreader 12 for receiving one end of the heat pipe 16.

The heat pipe 16 is substantially U-shaped, and comprises a connecting portion 162 and two horizontal portions 164 extending perpendicularly from two opposite ends of the connecting portion 162. The two horizontal portions 164 can define a lower horizontal portion 164 and an upper horizontal portion 164 above the lower one according to FIG. 2.

The fins 14 each are substantially rectangular flakes and made of highly heat conductive material such as copper, aluminum and so on. Each fin 14 defines a through hole 140 at a corresponding position therein. In order to increase a contacting area between the fins 14 and the heat pipe 16, an annular flange 142 protrudes from an edge of the through hole 140. The through holes 140 incorporate the flanges 142 of all the fins 14 to define a channel (not labeled) for receiving the lower horizontal portion 164 of the heat pipe 16.

In use of the heat dissipation system 10, the spreader 12 is kept in close contact with the CPU 22 on the printed circuit board 20. The fins 14 is disposed between the printed circuit board 20 and the base plate 31 of the enclosure 30, and abut against the base plate 31 of the enclosure 30. The lower horizontal portion 164 is transversely extended through the fins 14, and the upper horizontal portion 164 is received in the circular channel 120 of the spreader 12; thus, the spreader 12 and fins 14 are thermally connected together. The connecting portion 164 extends around an edge (not labeled) of the printed circuit board 20. The two horizontal portions 164 are respectively secured in the circular channel 120 of the spreader 12 and the annular channel of the fins 14 by soldering, and the fins 14 are secured on the base plate 31 by soldering. A coating of thermal grease is applied between the spreader 12 and the CPU 22, to reduce heat resistance therebetween.

The heat originated from the CPU 22 is first absorbed by the spreader 12 with a part of the heat being then transferred to the fins 14 via the heat pipe 16. One part of the heat transferred to the fins 14 is directly dissipated to ambient air, while the other part of the heat transferred to the fins 14 is conducted to the base plate 31 of the enclosure 30 to be dissipated. Therefore, the heat generated by the CPU 22 is dissipated away by the spreader 12, the fins 14 and the enclosure 30.

According to the preferred embodiment of the present invention, the heat pipe 16 couples the spreader 12 to the fins 14, which directly contact with the enclosure 30. In this way, the enclosure 30 can be utilized to dissipate the heat generated by the CPU 22. This serves to increase the heat dissipating area of the heat dissipation system 10; accordingly, heat dissipation capacity of the heat dissipation system 10 is improved.

It can be easily understood that a proper cooling device like a plurality of fins may be attached to the spreader 12 to meet higher heat dissipation requirements. Additionally, the through holes 140 may be formed at bottom edges of the fins 14 so that the horizontal portion 164 of the heat pipe 16 can directly contact with the fins 14 and the base plate 31 of the enclosure 30, simultaneously. Therefore, the fins 14 and the base plate 31 of the enclosure 30 can dissipate the heat originating from the CPU 22 simultaneously.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation system used for dissipating heat generated by an electronic device mounted on a printed circuit board over a base plate of an enclosure of an electronic equipment, the heat dissipation system comprising:
   a spreader adapted for contacting the electronic device for absorbing heat generated by the electronic device, the spreader defining a channel therein;
   a plurality of fins located at one side of the printed circuit board opposite the spreader and thermally attaching to the enclosure; and
   a heat pipe having two ends, one end of the heat pipe being received in the channel of the spreader, another end of the heat pipe extending through the fins, whereby a part of heat generated by the electronic device is transferred to the enclosure via the heat pipe and the fins;
   wherein the fins are located in a space beneath the printed circuit board, sandwiched between the printed circuit board and the base plate of the enclosure and abut against the base plate of the enclosure.

2. The heat dissipation system of claim 1, wherein the enclosure comprises a base plate, on which the printed circuit board is mounted, and the fins are arranged on the base plate.

3. The heat dissipation system of claim 2, wherein the fins are thermally attached to the base plate by soldering.

4. The heat dissipation system of claim 2, wherein a layer of thermal grease is positioned between the spreader and the electronic device.

5. The heat dissipation system of claim 1, wherein the fins each have a through hole therein and an annular flange extending from a rim of the through hole, the through holes incorporate the flanges of all the fins to define a channel for receiving the another end of the heat pipe.

6. The heat dissipation system of claim 1, wherein the spreader indirectly thermally connects with the fins via the heat pipe.

7. The heat dissipation system of claim 1, wherein the heat pipe is substantially U-shaped and has a connecting portion and two horizontal portions extending through the spreader and the fins respectively.

8. A heat dissipation system used for dissipating heat generated by an electronic device mounted on a printed circuit board, the heat dissipation system comprising:
   an enclosure adapted to receive the electronic device therein, the enclosure having a base plate on which the printed circuit board is mounted;
   a spreader adapted for contacting the electronic device in the enclosure;
   a plurality of fins located in a space beneath the printed circuit board, sandwiched between the printed circuit board and the base plate, abutting against the base plate of the enclosure and thermally engaging with the base plate; and
   a heat pipe thermally connecting the spreader and the fins together;
   wherein the spreader and the fins are positioned at opposite sides of the printed circuit board, and are in indirectly thermal engaging relation with each other via the heat pipe.

9. The heat dissipation system of claim 8, wherein the fins are thermally attached to the enclosure by soldering.

10. The heat dissipation system of claim 8, wherein thermal grease is filled in an interface between the spreader and the electronic device.

11. The heat dissipation system of claim 8, wherein the fins each have at least a through hole defined therein and an annular flange extending from a rim of each the through hole, the through holes incorporate corresponding flanges of all the fins to define a channel for receiving one end of the heat pipe.

12. The heat dissipation system of claim 8, wherein the fins each have a through hole formed at an edge thereof so that the heat pipe extends into the through hole and directly contacts with the fins and the base plate of the enclosure, simultaneously.

13. The heat dissipation system of claim 8, wherein the at least one heat pipe is substantially U-shaped, has a connecting portion and two horizontal portions extending through the spreader and the fins respectively.

14. A heat dissipation system comprising:
   an enclosure made of metal;
   a printed circuit board mounted in the enclosure;
   an electronic device mounted on a first surface of the printed circuit board;
   a first heat sink mounted on the electronic device and thermally connecting therewith;
   a second heat sink sandwiched between an opposite second surface of the printed circuit board and a plate of the enclosure, the second heat sink thermally connecting with the plate of the enclosure; and
   a U-shaped heat pipe having a first end portion thermally engaging with the first heat sink, a second end portion thermally engaging with the second heat sink and a connecting portion extending around an edge of the printed circuit board.

* * * * *